US010283368B2

(12) United States Patent
Mikami

(10) Patent No.: US 10,283,368 B2
(45) Date of Patent: May 7, 2019

(54) PLASMA ETCHING METHOD AND PLASMA ETCHING APPARATUS

(71) Applicant: TOKYO ELECTRON LIMITED, Tokyo (JP)

(72) Inventor: Shunichi Mikami, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/063,669

(22) Filed: Mar. 8, 2016

(65) Prior Publication Data

US 2016/0268140 A1 Sep. 15, 2016

(30) Foreign Application Priority Data

Mar. 9, 2015 (JP) .................................. 2015-046136

(51) Int. Cl.
  H01L 21/311 (2006.01)
  H01L 21/683 (2006.01)
  H01L 21/027 (2006.01)

(52) U.S. Cl.
  CPC .... H01L 21/31116 (2013.01); H01L 21/0276 (2013.01); H01L 21/31144 (2013.01)

(58) Field of Classification Search
  CPC .......... H01L 21/31116; H01L 21/0276; H01L 21/31144
  See application file for complete search history.

(56) References Cited

U.S. PATENT DOCUMENTS

| 6,287,752 B1* | 9/2001 | Yoshikawa | ....... H01L 21/31116 |
| | | | 216/72 |
| 6,583,065 B1 | 6/2003 | Williams et al. | |
| 7,759,239 B1* | 7/2010 | Lin | .................... H01L 21/0337 |
| | | | 257/E21.218 |

(Continued)

FOREIGN PATENT DOCUMENTS

JP   2003-506866 A   2/2003

OTHER PUBLICATIONS

Guenther et al. TOFSIMS Characterization of Molecular Contamination Induced Resist Scumming (Characterization and Metrology for ULSI Technology: 2003 International Conference. pp. 294 to 299).*

*Primary Examiner* — Duy Vu N Deo
*Assistant Examiner* — Mahmoud Dahimene
(74) *Attorney, Agent, or Firm* — Rothwell, Figg, Ernst & Manbeck P.C.

(57) ABSTRACT

There is provided a plasma etching method for etching a base film by a plasma using a photoresist as a mask. The method includes etching the base film by the plasma, under a first processing condition in which a selectivity of the photoresist to the base film is set to a first selectivity, while using as a mask the photoresist formed in a predetermined pattern by exposure and development and a scum remaining in the photoresist, without performing a process of removing the scum; and switching, during the etching of the base film, the first processing condition to a second processing condition in which the selectivity of the photoresist to the base film is set to a second selectivity lower than the first selectivity and further etching the base film by a plasma while using the photoresist as a mask under the second processing condition.

7 Claims, 9 Drawing Sheets

(56) References Cited

U.S. PATENT DOCUMENTS

2005/0070117 A1\* 3/2005 Jacobs .............. H01L 21/31116
438/710
2006/0068594 A1\* 3/2006 Dostalik, Jr. ..... H01L 21/31116
438/736

\* cited by examiner

FIG. 7

| STATE | COMPARATIVE EXAMPLE | TEST EXAMPLE |
|---|---|---|
| S0 | PR / ANTI-REFLECTION FILM / ORGANIC FILM (211, 210, L11, L12, 201, 203, 204) | PR / ANTI-REFLECTION FILM / ORGANIC FILM (211, 210, L11, L12, 201, 203, 204) |
| S1 | PR / ANTI-REFLECTION FILM / ORGANIC FILM (201, 203, 204) | |
| S2 | PR / ANTI-REFLECTION FILM / ORGANIC FILM (201, 203, 204) | PR / ANTI-REFLECTION FILM / ORGANIC FILM (201, 203, 204) |
| S3 | PR / ANTI-REFLECTION FILM / ORGANIC FILM (201, 203, 204, L03) | PR / ANTI-REFLECTION FILM / ORGANIC FILM (201, 203, 204, L13) |

FIG. 9

| TEST | PROCESSING GAS | RECIPE | | | SELECTIVITY | L13 | L23 | CD LOADING |
|---|---|---|---|---|---|---|---|---|
| | | PRESSURE | POWER | FLOW RATE | | | | |
| 1 | CF$_4$/CHF$_3$/C$_4$F$_8$ | 20mT | 500/100W | 110/20/4sccm | 0.79 | 57.9nm | 54.1nm | 3.8nm |
| 2 | CF$_4$/CH$_4$ | 20mT | 400/50W | 200/12sccm | 1.63 | 37.4nm | 35.1nm | 2.3nm |
| 3 | | 40mT | 500/100W | 350/50sccm | 2.05 | 39.9nm | 37.7nm | 2.2nm |
| 4 | CF$_4$/H$_2$ | 20mT | 400/100W | 250/70sccm | 3.58 | 42.9nm | 41.5nm | 1.4nm |
| 5 | | 40mT | 400/100W | 250/60sccm | 8.29 | – | – | – |
| 6 | | 20mT | 400/150W | 250/70sccm | 4.11 | 40.8nm | 41.9nm | -1.1nm |
| 7 | C$_4$F$_8$/Ar | 20mT | 400/200W | 10/200sccm | 6.11 | – | – | – |
| 8 | | 20mT | 400/200W | 7/800sccm | 11.2 | – | – | – |
| 9 | CHF$_3$/N$_2$ | 20mT | 500/100W | 100/30sccm | 2.51 | 38.8nm | 37.1nm | 1.7nm |
| 10 | | 40mT | 500/100W | 100/30sccm | 3.01 | 32.8nm | 31.3nm | 1.5nm |
| 11 | | 40mT | 500/150W | 100/30sccm | 3.31 | 38.2nm | 38.0nm | 0.2nm |
| 12 | CHF$_3$/BCl$_3$ | 20mT | 500/100W | 200/30sccm | 3.37 | 28.0nm | 31.8nm | -3.8nm |
| 13 | | 20mT | 500/150W | 100/30sccm | 5.01 | – | – | – |
| 14 | | 20mT | 500/150W | 200/30sccm | 4.95 | – | – | – |

PLASMA ETCHING METHOD AND PLASMA ETCHING APPARATUS

CROSS-REFERENCE TO RELATED APPLICATIONS

This application claims priority to Japanese Patent Application No. 2015-046136 filed on Mar. 9, 2015, the entire contents of which are incorporated herein by reference.

FIELD OF THE INVENTION

The disclosure relates to a plasma etching method and a plasma etching apparatus.

BACKGROUND OF THE INVENTION

In a semiconductor device manufacturing process, a photoresist is formed on a semiconductor wafer as a target substrate. Then, the photoresist is exposed using a photomask having a predetermined pattern and developed to have the predetermined pattern. By etching the semiconductor wafer by a plasma or the like while using the photoresist as a mask, grooves or holes of various shapes are formed on the semiconductor wafer. Depending on the pattern of the photomask, there may be formed on the semiconductor wafer a region where a density of the patterns of the grooves or the holes is high (hereinafter, referred to as "high-density region") and a region where a density of the patterns of the grooves or the holes is low (hereinafter, referred to as "low-density region").

When the high-density region and the low-density region coexist on the semiconductor wafer, there may occur CD (Critical Dimension) loading that is a difference between a dimension of the grooves or the holes formed at the high-density region and a dimension of the grooves or the holes formed at the low-density region. There is known, e.g., a technique for suppressing the occurrence of the CD loading by etching an etching target film by a plasma of a processing gas including an etchant gas comprising halogen species absent fluorine, and an additive gas comprising fluorine species and carbon species (see, e.g., Japanese Patent Application Publication No. 2003-506866)

However, when the pattern formed on the semiconductor wafer has the high-density region and the low-density region, the photoresist used for forming the pattern on the semiconductor wafer also has a high-density region and a low-density region. In the photoresist, a dimension of a mask that defines grooves or holes formed at the low-density region tends to be greater than a dimension of a mask that defines grooves or holes formed at the high-density region. If the dimension of the mask that defines the grooves or the holes formed at the photoresist is different between the high-density region and the low-density region, a dimension of the grooves or the holes formed at a base film that has been etched while using the photoresist film as a mask is also different between the high-density region and the low-density region.

SUMMARY OF THE INVENTION

In accordance with an aspect of the disclosure, there is provided a plasma etching method for etching a base film by a plasma using a photoresist as a mask. The method includes (a) etching the base film by the plasma, under a first processing condition in which a selectivity of the base film to the photoresist is set to a first selectivity, while using as a mask the photoresist formed in a predetermined pattern by exposure and development and a scum remaining in the photoresist, without performing a process of removing the scum; and (b) switching, during the etching of the base film, the first processing condition to a second processing condition in which the selectivity of the base film to the photoresist is set to a second selectivity lower than the first selectivity and further etching the base film by a plasma while using the photoresist as a mask under the second processing condition.

In view of the above, the disclosure provides a plasma etching method and a plasma etching apparatus capable of suppressing the CD loading.

BRIEF DESCRIPTION OF THE DRAWINGS

The objects and features of the disclosure will become apparent from the following description of embodiments, given in conjunction with the accompanying drawings, in which:

FIG. 7 schematically explains an example of a plasma etching process in a test example and a comparative example;

FIG. 9 shows an example of a CD loading measurement result in the case of varying a first processing gas;

DETAILED DESCRIPTION OF THE EMBODIMENTS

Figure 1:
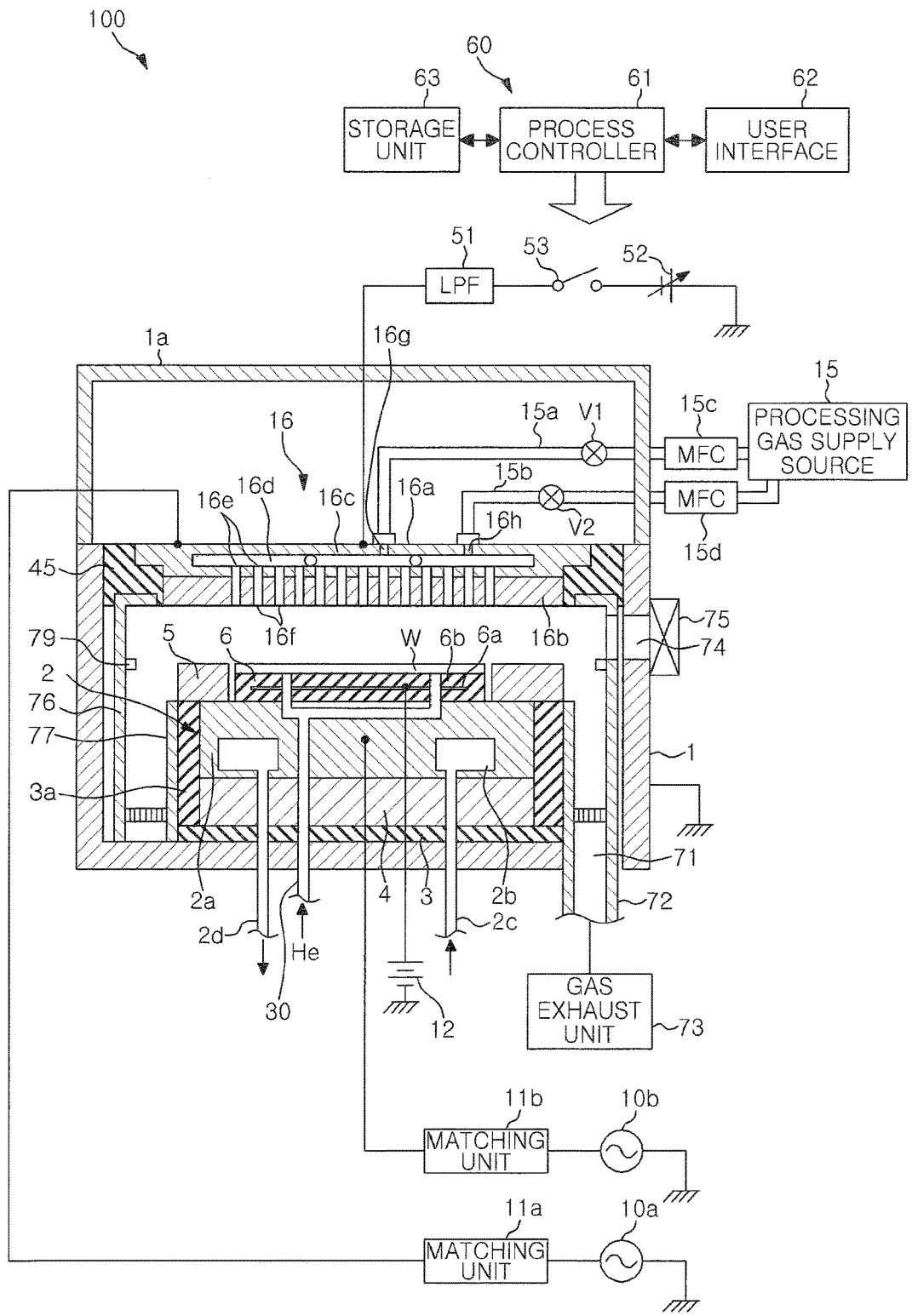
FIG. 1 is a vertical cross sectional view showing an example of a plasma etching apparatus.

In accordance with an aspect of the present invention, there is provided a plasma etching method for etching a base film by a plasma using a photoresist as a mask, including: (a) etching the base film by the plasma, under a first processing condition in which a selectivity of the base film to the photoresist is set to a first selectivity, while using as a mask the photoresist formed in a predetermined pattern by exposure and development and a scum remaining in the photoresist, without performing a process of removing the scum; and (b) switching, during the etching of the base film, the first processing condition to a second processing condition in which the selectivity of the base film to the photoresist is set to a second selectivity lower than the first selectivity and further etching the base film by a plasma while using the photoresist as a mask under the second processing condition.

Further, in accordance with an embodiment of the present disclosure, the first selectivity ranges from 2.5 to 4 and the second selectivity ranges from 0.5 to 1.

Further, in accordance with an embodiment of the present disclosure, in the first processing condition, one of a gaseous mixture of a fluorocarbon gas and a hydrocarbon gas, a gaseous mixture of a fluorocarbon gas and a hydrogen gas, a gaseous mixture of a hydrofluorocarbon gas and a nitrogen gas, and a gaseous mixture of a hydrofluorocarbon gas and a boron trichloride gas is used.

Further, in accordance with an embodiment of the present disclosure, in the second processing condition, a gaseous mixture of a fluorocarbon gas and a hydrofluorocarbon gas is used.

Further, in accordance with an embodiment of the present disclosure, the plasma processing method further includes, after the step (b), (c) switching the second processing condition to the first processing condition during the etching of the base film and further etching the base film by a plasma while using the photoresist as a mask under the first processing condition.

Further, in accordance with an embodiment of the present disclosure, the base film includes an anti-reflection film and an organic film, and in the step (a) and the step (b), the anti-reflection film is etched by the plasma while using the photoresist as the mask.

Further, in accordance with an embodiment of the present disclosure, in the step (a), 20% to 30% of a thickness of the anti-reflection film is etched.

Further, in accordance with an embodiment of the present disclosure, In accordance with an aspect of the present invention, there is provided a plasma etching apparatus including: a processing chamber where a base film is etched by a plasma while using a photoresist as a mask; a depressurization unit configured to depressurize the processing chamber; a gas supply unit configured to supply a processing gas into the processing chamber; and a control unit, wherein the control unit is configured to execute: a first process of etching the base film by the plasma, under a first processing condition in which a selectivity of the photoresist to the base film is set to a first selectivity, while using as a mask the photoresist formed in a predetermined pattern by exposure and development and a scum remaining at the photoresist, without performing a process of removing the scum; and a second process of switching, during the etching of the base film, the first processing condition to a second processing condition in which the selectivity of the photoresist to the base film is set to a second selectivity lower than the first selectivity and further etching the base film by a plasma while using the photoresist as a mask under the second processing condition.

Hereinafter, embodiments of a plasma etching method and a plasma etching apparatus will be described in detail with reference to the accompanying drawings. The present disclosure is not limited to those embodiments. The respective embodiments may be appropriately combined without contradicting processing contents.

Embodiment (Structure of Plasma Etching Apparatus 100)

FIG. 1 is a vertical cross sectional view showing an example of a plasma etching apparatus 100 according to an embodiment. The plasma etching apparatus 100 shown in FIG. 1 includes an airtight processing chamber 1 that is electrically grounded. The processing chamber 1 has a cylindrical shape and is made of aluminum or the like. Further, the processing chamber 1 has an anodically oxidized surface. A mounting table 2 for horizontally supporting a semiconductor wafer W as a target object is provided in the processing chamber 1.

The mounting table 2 has a base 2a made of a conductive metal, e.g., aluminum or the like. The base 2a serves as a lower electrode. The mounting table 2 is supported by a conductive supporting table 4. An insulating plate 3 is provided between the supporting table 4 and the processing chamber 1, so that the supporting table 4 and the processing chamber 1 are electrically insulated from each other. A focus ring 5 made of, e.g., single crystalline silicon or the like, is provided on an upper peripheral portion of the mounting table 2. A cylindrical inner wall member 3a made of, e.g., quartz or the like, is provided to surround the mounting table 2 and the supporting table 4.

A shower head 16 is provided above the mounting table 2 to face the mounting table 2 in parallel. In other words, the shower head 16 is provided to face the semiconductor wafer W supported on the mounting table 2. The shower head 16 serves as an upper electrode. The shower head 16 and the mounting table 2 serve as a pair of electrodes (an upper electrode and a lower electrode). The shower head 16 is connected to a high frequency power supply 10a via a matching unit 11a. The base 2a of the mounting table 2 is connected to a high frequency power supply 10b via a matching unit 11b. The high frequency power supply 10a supplies a high frequency power of a predetermined frequency (e.g., 60 MHz) to the shower head 16 via the matching unit 11a. The high frequency power supply 10b supplies a high frequency power of a predetermined frequency (e.g., 13 MHz) lower than that of the high frequency power from the high frequency power supply 10a to the base 2a of the mounting table 2 via the matching unit 11b. The high frequency power supply 10a is mainly used for plasma generation in the processing chamber 1. The high frequency power supply 10b is mainly used for ion attraction (bias) to the semiconductor wafer W mounted on the mounting table 2.

An electrostatic chuck 6 for electrostatically attracting and holding the semiconductor wafer W is provided on the top surface of the mounting table 2. The electrostatic chuck 6 is formed by embedding an electrode 6a in an insulator 6b. The electrode 6a is connected to a DC power supply 12. By applying a DC voltage from the DC power supply 12 to the electrode 6a, a Coulomb force is generated and the semiconductor wafer W is attracted and held on the electrode 6a by the Coulomb force thus generated.

A coolant path 2b is formed inside the mounting table 2. A coolant inlet line 2c and a coolant outlet line 2d are connected to the coolant path 2b. A coolant, e.g., Galden or the like, is circulated through the coolant path 2b, so that the supporting table 4 and the mounting table 2 can be controlled to a predetermined temperature. A backside gas supply line 30 for supplying a cold heat transfer gas (backside gas) such as He gas or the like to the backside of the semiconductor wafer W is provided to extend through the mounting table 2 and the like. The backside gas supply line 30 is connected to a backside gas supply source (not shown). With such configuration, the semiconductor wafer W electrostatically attracted and held on the top surface of the mounting table 2 by the electrostatic chuck 6 can be controlled to a predetermined temperature.

The shower head 16 is provided at an upper portion of the processing chamber 1. The shower head 16 has a main body 16a and an upper top plate 16b serving as an electrode plate. The shower head 16 is supported at the upper portion of the processing chamber 1 via an insulation member 45. The main body 16a is made of a conductive material, e.g., aluminum having an anodically oxidized surface. The upper top plate 16b is detachably attached to the bottom of the main body 16a. The upper top plate 16b is made of a silicon-containing material, e.g., silicon or the like.

A gas diffusion space is provided inside the main body 16a. The gas diffusion space is divided into a gas diffusion space 16c installed at a central portion and a gas diffusion space 16d installed around the gas diffusion space 16c. Since the gas diffusion space is divided into the central portion and the peripheral portion, the supply state of the processing gas in the central portion and the peripheral portion can be independently controlled. A plurality of gas through holes 16e is formed in the bottom portion of the main body 16a so as to be positioned below the gas diffusion spaces 16c and 16d.

Gas inlet holes 16f are formed through the upper top plate 16b in a thickness direction thereof and are overlapped with the gas through holes 16e in a vertical direction. With such configurations, the processing gas supplied into the gas diffusion spaces 16c and 16d is supplied and diffused in the processing chamber 1 in a shower shape through the gas through holes 16e and the gas inlet holes 16f. The main body 16a and the like are provided with lines (not shown) for circulating a coolant, so that the shower head 16 can be controlled to a desired temperature during the plasma etching process.

Two gas inlet ports 16g and 16h for introducing the processing gas into the gas diffusion spaces 16c and 16d are formed at the main body 16a. One end of the gas supply line 15a is connected to the gas inlet port 16g. One end of the gas supply line 15b is connected to the gas inlet port 16h. The other ends of the gas supply lines 15a and 15b are connected to a processing gas supply source 15 for supplying a processing gas for etching. The processing gas supply source 15 is an example of a gas supply unit. The gas supply line 15a is provided with a mass flow controller (MFC) 15c and an opening/closing valve V1. The gas supply line 15b is provided with a mass flow controller (MFC) 15d and an opening/closing valve V2.

The processing gas for plasma etching is supplied from the processing gas supply source 15 into the gas diffusion spaces 16c and 16d via the gas supply lines 15a and 15b, and then is supplied and diffused in the processing chamber 1 in a shower shape via the gas through holes 16e and the gas inlet holes 16f from the gas diffusion spaces 16c and 16d.

The shower head 16 serving as the upper electrode is electrically connected to a variable DC power supply 52 via a low pass filter (LPF) 51. ON/OFF of the variable DC power supply 52 can be controlled by a switch 53. A current/voltage of the variable DC power supply 52 and on/off of the switch 53 are controlled by a control unit 60 to be described later. As will be described below, when a plasma is generated in a processing space of the processing chamber 1 by applying the high frequency power from the high frequency power supply 10a to the shower head 16 and the high frequency power from the high frequency power supply 10b to the mounting table 2, the switch 53 is switched on, if necessary, by the control unit 69 and a predetermined DC voltage is applied to the shower head 16 serving as the upper electrode.

A cylindrical ground conductor 1a extends upward from the sidewall of the processing chamber 1 to be located at a position higher than the height position of the shower head 16. The cylindrical ground conductor 1a is grounded via the processing chamber 1.

A gas exhaust port 71 is formed at the bottom portion of the processing chamber 1. A gas exhaust unit 73 is connected to the gas exhaust port 71 via a gas exhaust line 72. The gas exhaust unit 73 has a vacuum pump. By operation of the vacuum pump, the inside of the processing chamber 1 can be depressurized to a predetermined vacuum level. The gas exhaust unit 73 is an example of a depressurization unit. An opening 74 through which the semiconductor wafer W is loaded into or unloaded from the processing chamber 1 is installed at the sidewall of the processing chamber 1. A gate valve 75 for opening/closing the opening 74 is provided at the opening 74.

Deposition shields 76 and 77 are detachably installed around the mounting table 2. The deposition shield 76 is provided along the inner wall surface of the processing chamber 1 and prevents etching by-products (deposits) from being attached to the processing chamber 1. A conductive member (GND block) 79 DC-connected to the ground is provided at a portion of the deposition shield 76 at a height substantially equal to the height of the semiconductor wafer W mounted on the electrostatic chuck 6. Due to the presence of the conductive member 79, an abnormal discharge in the processing chamber 1 is prevented.

The whole operation of the plasma etching apparatus 100 configured as described above is controlled by a control unit 60. The control unit 60 has a process controller 61 for controlling the respective units of the plasma etching apparatus 100, a user interface 62, and a storage unit 63. The process controller 61 is realized by, e.g., a CPU.

The user interface 62 includes a keyboard for a process manager to input commands to operate the plasma etching apparatus 100, a display for visualizing an operational status of the plasma etching apparatus 100, and the like.

The storage unit 63 stores therein recipes including a control program (software), processing condition data and the like for realizing various processes performed by the plasma etching apparatus 100 under the control of the process controller 61. When receiving a command from an operator via the user interface 62, the process controller 61 retrieves a necessary recipe in the storage unit 63 and executes it to cause the plasma etching apparatus 100 to perform a desired process. Further, the recipes including the control program, the processing condition data and the like can be stored in a computer-readable storage medium (e.g., a hard disk, a CD, a flexible disk, a semiconductor memory, or the like) or can be transmitted, when needed, from another apparatus, via, e.g., a dedicated line, and used on-line.

For example, the control unit 60 controls the respective units of the plasma etching apparatus 100 so that the plasma etching process to be described later can be performed. Specifically, a semiconductor wafer W in which a photoresist having a predetermined pattern formed by exposure and development is formed on a base film is loaded into the processing chamber 1 and mounted on the electrostatic chuck 6. The control unit 60 controls the MFCs 15c and 15d, and the opening/closing valves V1 and V2 to supply a first processing gas supplied from the processing gas supply source 15 into the processing chamber 1 through the gas inlet holes 16f of the shower head 16. The first processing gas is used in a first processing condition. In the present embodiment, as the first processing gas, there is used one selected among a gaseous mixture of a fluorocarbon gas and a hydrocarbon gas, a gaseous mixture of a fluorocarbon gas and a hydrogen gas, a gaseous mixture of a hydrofluorocarbon gas and a nitrogen gas, and a gaseous mixture of a hydrofluorocarbon gas and a boron trichloride gas.

Next, the control unit 60 controls the high frequency power supply 10a and the matching unit 11a so that the high frequency power of a predetermined frequency can be applied to the shower head 16, and also controls the high frequency power supply 10b and the matching unit 11b so that the high frequency power of a predetermined frequency can be applied to the base 2a of the mounting table 2. Accordingly, a plasma of the first processing gas is generated in the processing space between the shower head 16 and the mounting table 2.

The control unit 60 starts a process of etching the semiconductor wafer W by the plasma of the first processing gas while applying a negative DC voltage to the shower head 16 serving as the upper electrode. After the semiconductor wafer W is etched to a predetermined depth, the control unit 60 controls the gas exhaust unit 73 to discharge the first processing gas from the processing chamber 1. Further, the control unit 60 controls the MFCs 15c and 15d, and the opening/closing valves V1 and V2 to supply a second processing gas from the processing gas supply source 15 into the processing chamber 1 through the gas inlet holes 16f of the shower head 16. The second processing gas is used in a second processing condition. In the present embodiment, as the second processing gas, there is used, e.g., a gaseous mixture of a fluorocarbon gas and a hydrofluorocarbon gas.

Then, the control unit 60 controls the high frequency power supply 10a and the matching unit 11a so that the high frequency power of a predetermined frequency can be applied to the shower head 16, and also controls the high frequency power supply 10b and the matching unit 11b so that the high frequency power of a predetermined frequency can be applied to the base 2a of the mounting table 2. Accordingly, a plasma of the second processing gas is generated in the processing space between the shower head 16 and the mounting table 2. The control unit 60 restarts the process of etching the semiconductor wafer W by the plasma of the second processing gas while applying a negative DC voltage to the shower head 16. After the semiconductor wafer W is etched to a predetermined depth, the control unit 60 completes the plasma etching process.

(Structure of Semiconductor Wafer W)

Figure 2:
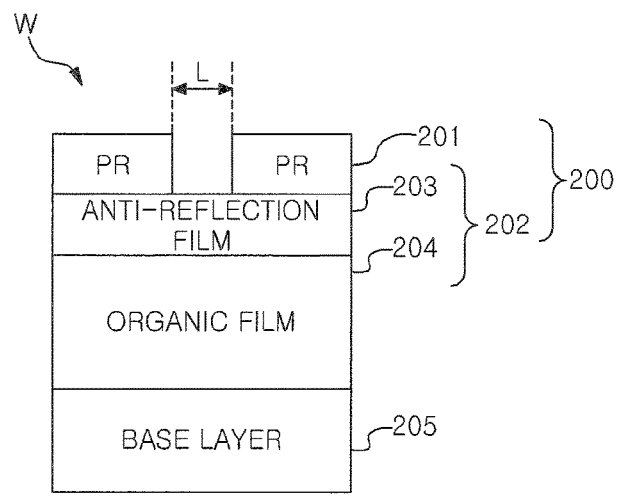
FIG. 2 schematically shows an example of a semiconductor wafer.

FIG. 2 is a schematic diagram showing an example of the semiconductor wafer W. The semiconductor wafer W shown in FIG. 2 includes, e.g., a base layer 205, and a mask layer 200 laminated on the base layer 205. The base layer 205 is, e.g., a polysilicon layer. The mask layer 200 has a base film 202 and a photoresist (PR) 201 laminated on the base film 202. The PR 201 is, e.g., an ArF resist.

The property of the ArF resist of the present embodiment is changed from a hydrophobic property to a hydrophilic property by irradiation of ArF excimer laser. For example, the property of a portion of the ArF resist to which the laser beam is irradiated is changed from the hydrophobic property to the hydrophilic property by performing an exposure process in which the ArF excimer laser is irradiated to the ArF resist through a photomask having a pattern covering a portion of the semiconductor wafer W to be remained. Then the developing process in which the semiconductor wafer W that has been subjected to the exposure process is submerged in a developing solution is performed, so that the portion of the ArF resist which has been changed to the hydrophilic portion dissolves in the developing solution. As a consequence, the pattern of the photomask is transferred to the ArF resist.

The base film 202 includes an organic film 204, and an anti-reflection film 203 formed on the organic film 204. The organic film 204 is an organic film containing carbon such as amorphous carbon or the like. The anti-reflection film 203 is an anti-reflection film containing silicon (SiARC) such as SiON or the like. The mask layer 200 is formed as a triple layer resist including the PR 201, the anti-reflection film 203, and the organic film 204.

The PR 201, which is formed in the shape of the photomask by the exposure and the development, may have a high-density region where the density of the patterns that define the grooves or the holes is high and a low-density region where the density of the patterns that define the grooves or the holes is low. In the PR 201 having the low-density region and the high-density region, even when the exposure and the development are performed so as to form patterns having the same CD, the CD of the pattern in the low-density region tends to be greater than the CD of the pattern in the high-density region. Therefore, when the base film 202 is subjected to the plasma etching while using the PR 201 having the low-density region and the high-density region as a mask, the CD of the grooves or the holes in the low-density region is greater than the CD of the grooves or the holes in the high-density region.

In the PR 201 that is formed in the shape of the photomask by the exposure and the development, a residual scum that has not been dissolved in the developing solution may remain at the portion that has become hydrophilic by the irradiation of the laser beam. In the PR 201 having the low-density region and the high-density region, the amount of the scum remaining at the pattern formed at the low-density region tends to be greater than the amount of the scum remaining at the pattern formed at the high-density region.

(PR 201 in Low-Density Region and PR 201 in High-Density Region)

Figure 3:
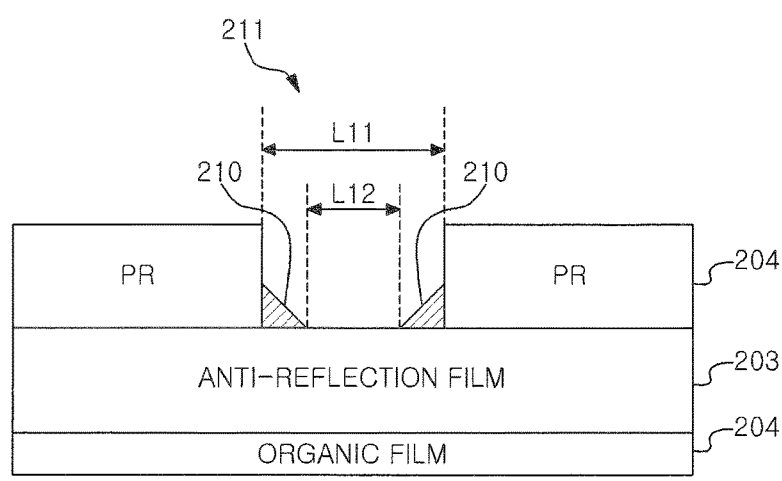
FIGS. 3 and 4 are cross sectional views showing an example of a low-density region PR after development.
Figure 4:
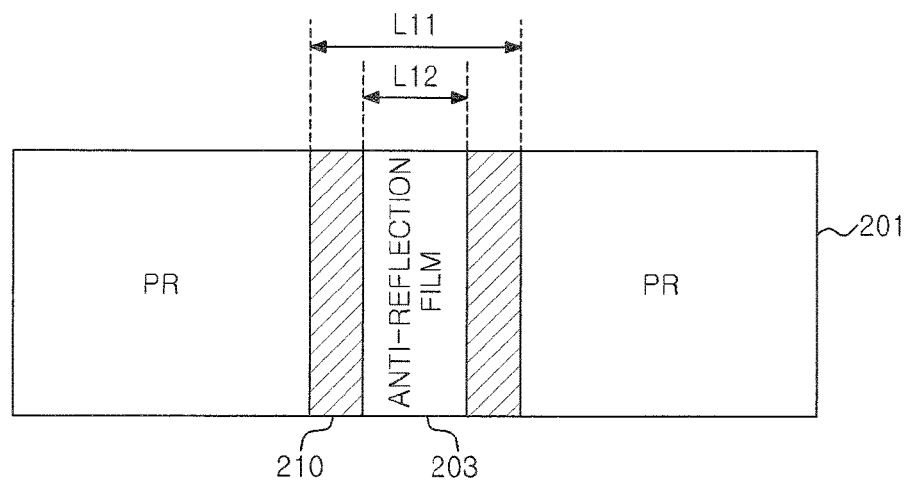
Figure 5:
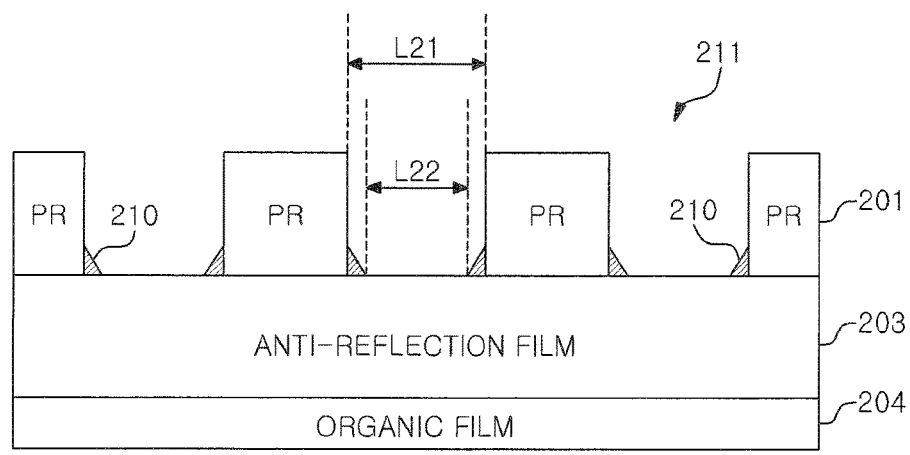
FIGS. 5 and 6 are cross sectional views showing an example of a high-density region PR after the development.
Figure 6:
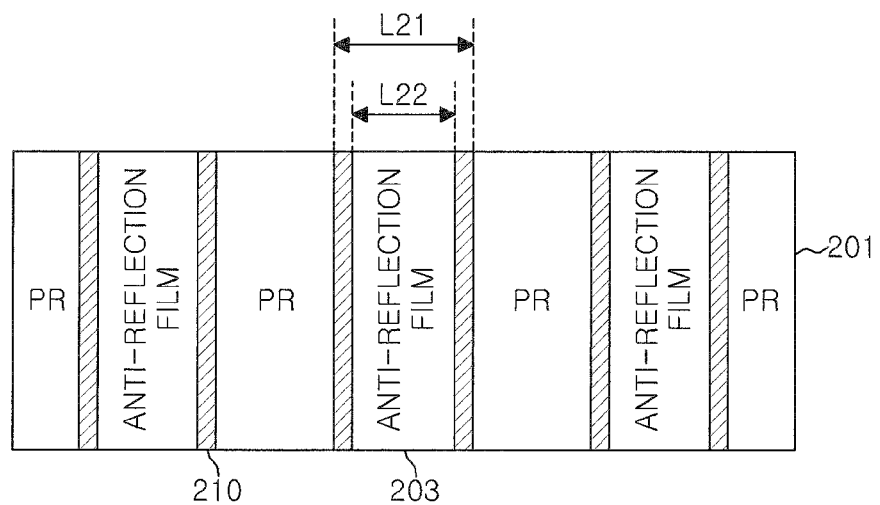

FIG. 3 is a cross sectional view showing an example of the PR 201 in the low-density region after the development. FIG. 4 is a top view showing the example of the PR 201 in the low-density region after the development. FIG. 5 is a cross sectional view showing an example of the PR 201 in the high-density region after the development. FIG. 6 is a top view showing the example of the PR 201 in the high-density region after the development. FIGS. 3 to 6 illustrate the PRs 201 which have been subjected to the exposure and the development using the photomasks of the patterns having substantially the same width.

In the PR 201 after the development, as shown in FIGS. 3 to 5, L11 that is a CD of the opening 211 formed at the low-density region tends to be greater than L21 that is a CD of the opening 211 formed at the high-density region.

In the PR 201 after the development, as shown in FIGS. 3 to 5, a scum 210 remains near the edge of the opening 211 formed in the PR 201. A larger amount of the scum 210 tends to remain at the opening 211 of the low-density region than at the opening 211 of the high-density region. In the low-density region, as shown in FIG. 3, L12 that is a CD of the pattern formed by the scum 210 remaining in the opening 211 is smaller than L11 that is a CD of the pattern formed at the opening 211 of the PR 201.

In the high-density region, as shown in FIG. 5, L22 that is a CD of the pattern formed by the scum 210 remaining in the opening 211 is smaller than L21 that is a CD of the pattern formed at the opening 211 of the PR 201. However, a considerably smaller amount of the scum 210 remains at the opening 211 of the high-density region than at the opening 211 of the low-density region. Accordingly, L21 and L22 are substantially the same.

The PR 201 and the scum 210 are made of the same material. Therefore, when the semiconductor wafer W subjected to the development is viewed from the PR 201 side, as shown in FIG. 4, L12 that is the CD of the pattern formed by the scum 210 is seen as the CD of the pattern formed in the PR 201, in the low-density region. Accordingly, after the anti-reflection film 203 below the PR 201 is etched by using, as an initial CD, L12 that is the CD of the pattern formed by the scum 210 after the development, there is evaluated a difference (bias value) between the initial CD and the CD of the grooves or the holes formed in the anti-reflection film 203.

Similarly, in the high-density region, L22 that is the CD of the pattern formed by the scum 210 is seen as the CD of the pattern formed in the PR 201, as shown in FIG. 6. However, in the high-density region, the amount of the scum 210 remaining at the opening 211 is small, so that L21 that is the CD of the pattern formed at the opening 211 has substantially the same width as that of L22 that is the CD of the pattern formed by the scum 210.

The CD of the pattern formed by the opening 211 of the scum 210 after the development is referred to as ADI (After Development Inspection). The CD of the grooves or the holes which are formed in the anti-reflection film 203 by etching the anti-reflection film 203 below the PR 201 using the PR 201 as a mask, is referred to as AEI (After Etch Inspection).

Here, it is preferable that the bias value that is the difference between ADI and AEI is small. Even when the bias value is not small, it is preferable that the grooves or the holes designed to have the same CD have substantially the same bias value. Especially, it is preferable that the bias value of the CD of the grooves or the holes at the low-density region is substantially the same as the bias value of the CD of the grooves or the holes at the high-density region. In the present embodiment, a difference between the CD of the grooves formed at the low-density region and the CD of the grooves formed at the high-density region is referred to as CD loading.

(Outline of Processing)

FIG. 7 schematically explains examples of a plasma etching process in a test example and a comparative example. The example shown in FIG. 7 illustrates an exemplary outline of the plasma etching process in the low-density region. A conventional plasma etching process is illustrated as the comparative example at the left side of FIG. 7.

In the comparative example, a state S0 of the semiconductor wafer W after the development of the PR 201 is illustrated at the uppermost portion of FIG. 7. In the comparative example, the process of removing the scum 210 is performed on the semiconductor wafer W in the state S0. As a consequence, the state of the semiconductor wafer W of the comparative example becomes a state S1. The scum 210 is removed to improve LWR (Line Width Roughness), SWR (Space Width Roughness), and LER (Line Edge Roughness) of the mask pattern formed by the PR 201.

In the comparative example, the semiconductor wafer W in the state S1 is loaded into the plasma etching apparatus 100, and the anti-reflection film 203 is etched by the plasma of the processing gas while using the PR 201 as a mask. The state of the anti-reflection film 203 that is being etched is illustrated in a state S2 of the comparative example indicates. In the etching of the anti-reflection film 203 in the comparative example, a processing gas having a selectivity of the anti-reflection film 203 to the PR 201 which ranges from 0.5 to 1 is used. Accordingly, the anti-reflection film 203 is etched to a predetermined depth while leaving the PR 201.

Then, overetching is performed for a predetermined period of time and the state of the semiconductor wafer W of the comparative example becomes a state S3. In the plasma etching process of the comparative example, the etching of the anti-reflection film 203 is started while using as a mask the PR 201 having the opening 211 of the width L11 after the removal of the scum 210. Therefore, L03 that is CD of the bottom portion of the grooves formed in the anti-reflection film 203 is greater than L12 that is CD of the pattern formed by the scum 210. In the comparative example, ADI and AEI correspond to L12 and L03, respectively, and a difference between L12 and L03 is a bias value.

In the plasma etching process of the test example illustrated at the right side of FIG. 7, the semiconductor wafer W in the state S0 shown at the uppermost portion of FIG. 7, i.e., the semiconductor wafer W after the development of the PR 201, is not subjected to the process of removing the scum 210, and the plasma etching of the anti-reflection film 203 is performed while using the PR 201 and the scum 210 as a mask.

Specifically, the semiconductor wafer W in the state S0 of the test example is loaded into the plasma etching apparatus 100, and the plasma etching of the anti-reflection film 203 is performed under the first processing condition by the plasma etching apparatus 100 while using the PR 201 and the scum 210 as a mask. The state in which the anti-reflection film 203 is being etched is illustrated as the state S2 of the test example.

In the first processing condition, the processing gas having the selectivity of the anti-reflection film 203 to the PR 201 which ranges from 2.5 to 4 is used. Accordingly, the anti-reflection film 203 is etched to a predetermined depth while leaving the PR 201 and the scum 210. The predetermined depth is, e.g., 20% to 30% of the thickness of the anti-reflection film 203. More preferably, the predetermined depth may be, e.g., 25% of the thickness of the anti-reflection film 203.

Next, in the second processing condition, the plasma etching of the anti-reflection film 203 is continued under the second processing condition by the plasma etching apparatus 100 while using the PR 201 as a mask. In the second processing condition, the processing gas having the selectivity of the anti-reflection film 203 to the PR 201 which ranges from 0.5 to 1 is used. Accordingly, the etching is continued until the bottom portion of the groove formed in the anti-reflection film 203 reaches the organic film 204 formed therebelow while leaving the PR 201. Then, the overetching is performed for a predetermined period of time under the second processing condition, and the state of the semiconductor wafer W of the test example becomes a state S3.

In the plasma etching process of the test example illustrated in FIG. 7, the etching of the anti-reflection film 203 is started while using the PR 201 and the scum 210 as a mask. Therefore, as illustrated in the state S3, L13 that is CD of the bottom portion of the groove formed in the anti-reflection film 203 becomes close to L12 that is CD of the pattern formed by the scum 210. In the test example, ADI and AEI correspond to L12 and L13, respectively, and a difference between L12 and L13 is a bias value.

In the test example, the anti-reflection film 203 is etched to a predetermined depth by the plasma of the first processing gas while using the PR 201 and the scum 210 as a mask without performing the process of removing the scum 210 on the semiconductor wafer W after the development of the PR 201. Then, the processing gas is switched to the second processing gas having a lower selectivity of the anti-reflection film 203 to the PR 201 than that of the first processing gas during the etching of the anti-reflection film 203, and the etching of the anti-reflection film 203 is restarted by the plasma of the second processing gas. Accordingly, in the low-density region, the bias value that is the difference between ADI and AEI can be reduced compared to the conventional case.

In the test example, the anti-reflection film 203 is etched by the plasma of the first processing gas without performing the process of removing the scum 210. Therefore, the LWR of the PR 201 or the like deteriorates due to the scum 210. However, the LWR of the PR 201 or the like can be improved by another process different from the process of removing the scum 210, i.e., the process of controlling pressures of the first processing gas and the second processing gas, the high frequency powers applied to the shower head 16 and the base 2a of the mounting table 2, or the like. Therefore, the deterioration of the LWR of the PR 201 or the like which is caused by omitting the process of removing the scum 210 can be suppressed by using another process.

Figure 8:
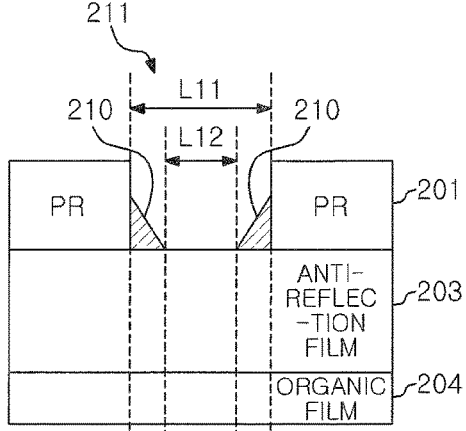
FIG. 8 explains an example of the plasma etching process performed in a low-density region and a high-density region in the test example.

FIG. 8 explains the example of the plasma etching process performed in the low-density region and the high-density region in the test example.

First, the semiconductor wafer W in the state S0 after the development of the PR 201 is loaded into the plasma etching apparatus 100 without being subjected to the process of removing the scum 210. The low-density region and the high-density region of the semiconductor wafer W in the state S0 are illustrated at the uppermost portion of FIG. 8, for example.

The plasma etching of the anti-reflection film 203 is performed under the first processing condition by the plasma etching apparatus 100 while using the PR 201 and the scum 210 as a mask. In the low-density region of the semiconductor wafer W, the plasma etching of the anti-reflection film 203 is started under the first processing condition while using the PR 201 and the scum 210 as the mask, as can be seen from the state S4 illustrated at the left side of FIG. 8.

In the low-density region of the semiconductor wafer W, the first processing condition is switched to the second processing condition in a state S5 where the plasma etching of the anti-reflection film 203 is performed to a predetermined depth (e.g., 20% to 30% of the thickness of the anti-reflection film 203). Then, the plasma etching of the anti-reflection film 203 is continued under the second processing condition while using the PR 201 as a mask.

In the low-density region of the semiconductor wafer W, the first processing gas used in the first processing condition has a relatively high selectivity of the anti-reflection film 203 to the PR 201 which ranges from 2.5 to 4. However, the scum 210 disappears while the anti-reflection film 203 is being plasma-etched to a predetermined depth. When the plasma etching of the anti-reflection film 203 is restarted under the second processing condition, the scum 210 does not remain in the opening 211.

In the low-density region of the semiconductor wafer W, overetching is performed for a predetermined period of time under the second processing condition after the bottom of the grooves formed in the anti-reflection film 203 reaches the organic film 204 formed therebelow. Accordingly, the state of the semiconductor wafer W in the low-density region becomes a state S6 shown at the left side of FIG. 8. In the low-density region, the etching of the anti-reflection film 203 is started while using the PR 201 and the scum 210 as a mask. Therefore, L13 that is the CD of the bottom portion of the groove formed in the anti-reflection film 203 is smaller than L11 that is the CD of the opening 211 of the PR 201 and close to L12 that is the CD of a pattern formed by the scum 210. In the low-density region shown in FIG. 8, ADI and AEI correspond to L12 and L13, respectively, and a difference between L12 and L13 is a bias value.

On the other hand, in the high-density region, the semiconductor wafer W in the state S0 after the development of the PR 201 is loaded into the plasma etching apparatus 100 without being subjected to the process of removing the scum 210 and, then, the plasma etching of the anti-reflection film 203 is performed under the first processing condition by the plasma etching apparatus 100 while using the PR 201 and the scum 210 as a mask. In the high-density region, a small amount of the scum 210 remains at the opening 211 of the PR 201, so that the scum 210 disappears within a short period of time when the plasma etching is started even under the first processing condition using the first processing gas having a relatively high selectivity. Accordingly, in the high-density region, the plasma etching is started while using as the initial CD the width substantially the same as L21 that is the CD of the pattern formed by the opening 211 of the PR 201, as can be seen from the state S4 of FIG. 8.

In the high-density region of the semiconductor wafer W, the first processing condition is switched to the second processing condition in the state S5 where the anti-reflection film 203 is plasma-etched to a predetermined depth (e.g., 20% to 30% of the thickness of the anti-reflection film 203). The plasma etching of the anti-reflection film 203 is continued under the second processing condition while using the PR 201 as a mask.

In the high-density region of the semiconductor wafer W, the overetching is performed for a predetermined period of time under the second processing condition after the bottom of the grooves formed in the anti-reflection film 203 reaches the organic film 204 formed therebelow. Accordingly, the state of the semiconductor wafer W in the high-density region becomes the state S6. In the high-density region, the etching of the anti-reflection film 203 is started while using as a mask a pattern substantially the same as the pattern formed by the opening 211 of the PR 201. Therefore, L23 that is a CD of the bottom portion of the grooves formed in the anti-reflection film 203 becomes close to L21 that is a CD of the pattern formed by the opening 211. In the high-density region, ADI and AEI correspond to L21 and L23, respectively, and a difference between L21 and L23 is a bias value.

The anti-reflection film 203 is plasma-etched to a predetermined depth while using as a mask the scum 210 remaining after the development under the first processing condition in which the selectivity of the anti-reflection film 203 to the PR 201 is relatively high. Accordingly, in the low-density region where a large amount of the scum 210 remains, AEI can be reduced compared to the conventional case. In the high-density region where a small amount of the scum 210 remains, AEI can be maintained at a level similar to that in the conventional case. Therefore, the bias value that is the difference between ADI and AEI in the low-density region may become close to the bias value in the high-density region. As a result, the difference between the bias value in the low-density region and the bias value in the high-density region can be reduced and, further, the CD loading can be reduced.

(Test Results)

Hereinafter, the measurement results of the CD loading in the case of varying the first processing gases will be described. FIG. 9 shows examples of the CD loading measurement result in the case of varying the first processing gas.

As shown in FIG. 9, in the tests, the selectivity of the anti-reflection film 203 to the PR 201, the CD in the low-density region (L13 in FIG. 8), the CD in the high-density region (L23 in FIG. 8), and the CD loading were measured while varying a pressure, a power, and a gas flow rate in six processing gases. In FIG. 9, a difference between the measured CD of the grooves formed at the high-density region and the measured CD of the grooves formed at the low-density region was calculated as the CD loading.

The processing gases and the recipes used in the test 1 shown in FIG. 9 are the same as the second processing gas and the recipes used in the second processing condition. Further, the processing gases and the recipes used in the test 1 shown in FIG. 9 are the same as the processing gases and the recipes used for the plasma etching of the anti-reflection film 203 in the comparative example (conventional plasma etching) shown in FIG. 7.

The processing gases and the recipes used in tests 2 to 14 of FIG. 9 are the same as the first processing gas and the recipes used in the first processing condition. In the test examples 2 to 14, the anti-reflection film 203 was plasma-etched to a predetermined depth (25% of the thickness of the anti-reflection film 203) by using the processing gases and the recipes in the columns of the tests 2 to 14 of FIG. 9 and, then, the plasma etching of the remaining anti-reflection film 203 was performed by using the processing gases and the recipes in the column of the test 1. In the test 1, the plasma etching of the anti-reflection film 203 was performed without switching the processing gases and the recipes in the column of the test 1.

For example, in the test 9 of FIG. 9, a gaseous mixture of $CHF_3$ gas and $N_2$ gas was used as the first processing gas. In the test 9, the pressure in the processing chamber 1 was set to 20 mT; the high frequency power of 500 W was applied to the shower head 16; and the high frequency power of 100 W was applied to the base 2a of the mounting table 2. In the test 9, the flow rates of $CHF_3$ gas and $N_2$ gas were set to 100 sccm and 30 sccm, respectively.

In the test 9, the selectivity of the anti-reflection film 203 to the PR 201 was 2.51. In the test 9, L13 in the low-density region was 38.8 nm; L23 in the high-density region was 37.1 nm; and the CD loading was 1.7 nm.

In the table of FIG. 9, dash "-" in the columns of the test results of L13, L23 and the CD loading indicates a state where the plasma etching was stopped to make a measurement impossible.

Figure 10:
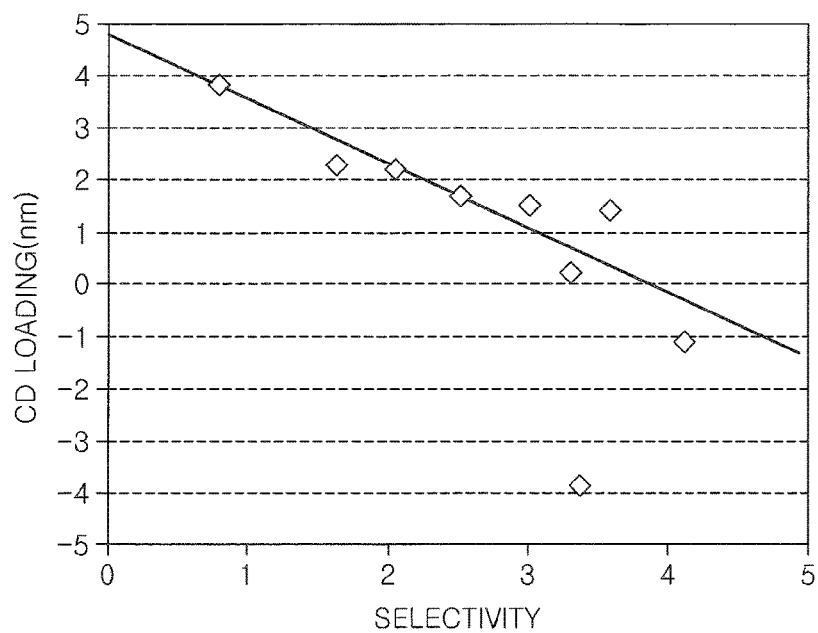
FIG. 10 shows an example of relation between a selectivity and a CD loading.

FIG. 10 shows relation between the selectivity and the CD loading obtained based on the test results shown in FIG. 9. FIG. 10 shows exemplary relation between the selectivity and the CD loading.

Referring to FIG. 10, the CD loading tends to be decreased as the selectivity is increased. However, if the selectivity is increased excessively, the plasma etching stops. According to the test results shown in FIG. 9, the etching stopped in the test 14 in which the selectivity was 4.95 and the etching did not stop in the test 6 in which the selectivity was 4.11. Therefore, it is considered that the upper limit of the selectivity which allows the grooves to be formed in the anti-reflection film 203 without stopping the etching ranges from 4.11 to 4.95.

Referring to FIG. 10, when the selectivity ranges from 1.63 to 4.11, the CD loading is smaller than 3.8 that is the CD loading measured in the test 1 in which the conventional plasma etching is performed. Referring to FIG. 9, the selectivity ranging from 1.63 to 4.11 is obtained under the processing conditions of the tests 2 to 4, 6, and 9 to 12. The CD loading can be reduced compared to the conventional case by performing the plasma etching under the processing conditions of the tests 2 to 4, 6 and 9 to 12 shown in FIG. 9.

In the test 2, a gaseous mixture of $CF_4$ gas and $CH_4$ gas was used as the processing gas. In the tests 3, 4, and 6, a gaseous mixture of $CF_4$ gas and $H_2$ gas was used as the processing gas. In the tests 9 to 11, a gaseous mixture of $CHF_3$ gas and $N_2$ gas was used as the processing gas. In the test 12, a gaseous mixture of $CHF_3$ gas and $BCl_3$ gas was used as the processing gas.

Referring to FIG. 10, the CD loading can be reduced to 2 nm or less when the selectivity ranges from, e.g., 2.5 to 4.11. Referring to FIG. 9, the selectivity ranging from 2.5 to 4 is obtained under the processing conditions of the tests 6, 9 to 11 and 12.

As shown in FIGS. 9 and 10, when the selectivity is increased, the CD loading is decreased and becomes smaller than zero. In other words, when the selectivity is increased, the CD of the grooves formed at the low-density region may become smaller than the CD of the grooves formed at the high-density region. This is because the increase in the selectivity leads to the increase in the amount of carbon radicals in the plasma and those carbon radicals are adhered to the surface of the PR 201. In the low-density region, the coverage of the PR 201 is high, so that the amount of carbon radicals adhered to the PR 201 is greater than that in the high-density region. Since a large amount of carbon radicals are adhered to the PR 201, the opening 211 of the PR 201 in the low-density region becomes smaller than the opening 211 of the PR 201 in the high-density region. Therefore, the CD of the grooves formed at the low-density region becomes smaller than the CD of the grooves formed at the high-density region.

[Processing Sequence]

Figure 11:
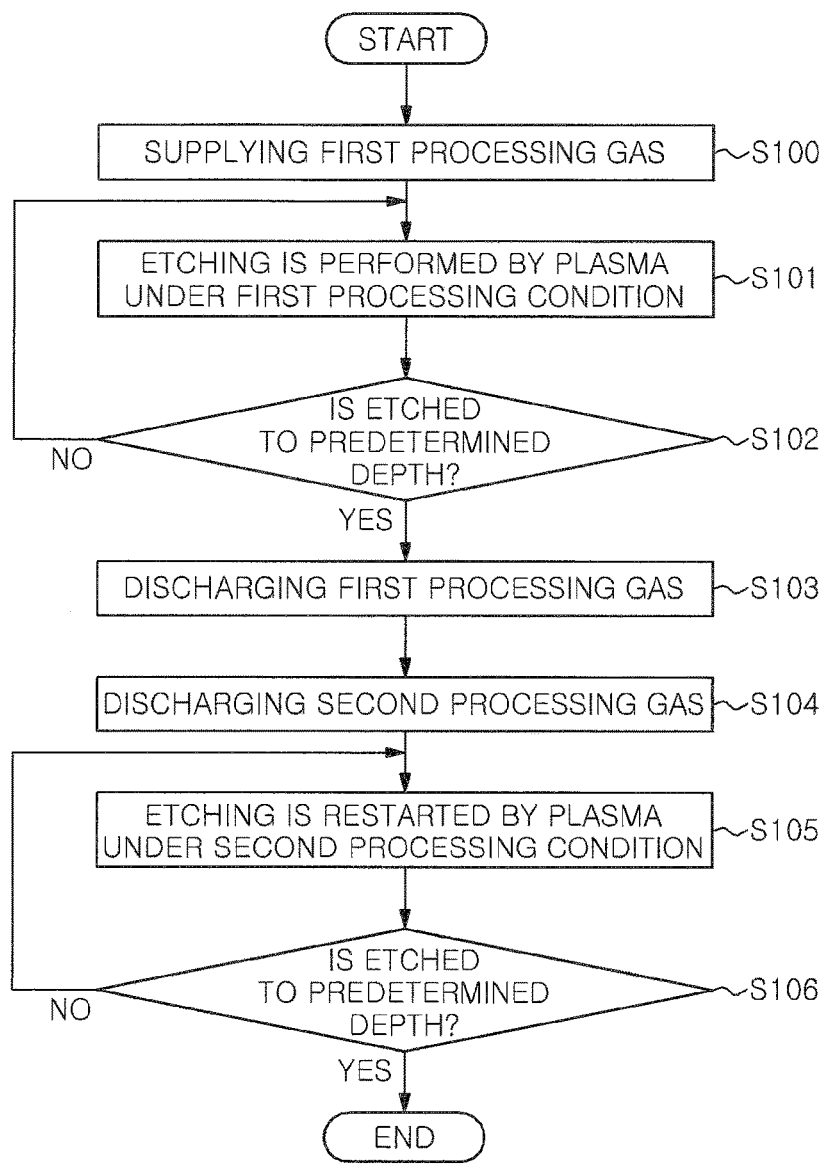
FIG. 11 is a flowchart showing an exemplary sequence of the plasma etching process.

FIG. 11 is a flowchart showing a processing sequence of the plasma etching. For example, the semiconductor wafer W after the development of the PR 201 is loaded into the processing chamber 1 of the plasma etching apparatus 100 and mounted on the electrostatic chuck 6. Then, the plasma etching apparatus 100 starts the operation shown in FIG. 11.

First, the control unit 60 controls the MFCs 15c and 15d, and the opening/closing valves V1 and V2 so that the first processing gas can be supplied from the processing gas supply source 15 into the processing chamber 1 through the gas inlet holes 16f of the shower head 16 (S100).

Next, the control unit 60 controls the high frequency power supply 10a and the matching unit 11a so that a high frequency power of a predetermined frequency is applied to the shower head 16. The control unit 60 also controls the high frequency power supply 10b and the matching unit 11b so that a high frequency power of a predetermined frequency is applied to the mounting table 2. Accordingly, a plasma of the first processing gas is generated between the shower head 16 and the mounting table 2. Further, the control unit 60 controls the switch 53 so that a negative DC voltage is applied to the shower head 16 serving as the upper electrode. Accordingly, the anti-reflection film 203 formed below the PR 201 is etched by the plasma of the first processing gas while using the PR 201 and the scum 201 as a mask. As a result, the plasma etching of the anti-reflection film 203 is performed while using the PR 201 and the scum 210 as a mask under the first processing condition (S101).

Next, the control unit 60 determines whether or not the anti-reflection film 203 has been etched to a predetermined depth (S102). The control unit 60 determines whether or not the anti-reflection film 203 has been etched to the predetermined depth by determining whether or not a preset period of time required to etch the anti-reflection film 203 to the predetermined depth has elapsed. When the anti-reflection film 203 has not been etched to the predetermined depth (S102: No), the control unit 60 performs the processing of the step S101 again.

On the contrary, when the anti-reflection film 203 has been etched to the predetermined depth (S102: Yes), the control unit 60 controls the gas exhaust unit 73 so that the first processing gas can be discharged from the processing chamber 1 (S103). Further, the control unit 60 controls the MFCs 15c and 15d and the opening/closing valves V1 and V2 so that the second processing gas can be supplied from the processing gas supply source 15 into the processing chamber 1 through the gas inlet holes 16f of the shower head 16 (S104).

Then, the control unit 60 controls the high frequency power supply 10a and the matching unit 11a so that a high frequency power of a predetermined frequency is applied to the shower head 16, and controls the high frequency power supply 10b and the matching unit 11b so that a high frequency power of a predetermined frequency is applied to the mounting table 2. Accordingly, a plasma of the second processing gas is generated between the shower head 16 and the mounting table 2. Further, the control unit 60 controls the switch 53 so that a negative DC voltage is applied to the shower head 16. Accordingly, the etching of the base film on the semiconductor wafer W is restarted by the plasma of the second processing gas while using the photoresist as a mask. As a result, the plasma etching of the anti-reflection film 203 is performed under the second processing condition while using the PR 201 as a mask (S105).

Next, the control unit 60 determines whether or not the anti-reflection film 203 has been etched to the predetermined depth (S106). When the anti-reflection film 203 has not been etched to the predetermined depth (S106: No), the control unit 60 performs the processing of the step S105 again. On the contrary, when the anti-reflection film 203 has been etched to the predetermined depth (S106: Yes), the control unit 60 completes the operation shown in the flowchart.

As described above, the plasma etching apparatus 100 of the present embodiment can suppress the CD loading.

(Others)

In the above embodiment, the plasma etching of the anti-reflection film 203 was performed to the predetermined depth while using the PR 201 and the scum 210 as a mask under the first processing condition without performing the process of removing the scum 210 on the semiconductor wafer W after the development of the PR 201 and, then, the plasma etching of the anti-reflection film 203 was continued while using the PR 201 as the mask under the second processing condition. However, the present disclosure is not limited thereto.

For example, it is also possible to plasma-etch the anti-reflection film 203 to the predetermined depth while using the PR 201 and the scum 210 as a mask under the first processing condition without performing the process of removing the scum 210 on the semiconductor wafer W after the development of the PR 201, then, continue the plasma-etching of the anti-reflection film 203 under the second processing condition and, then, continue the plasma-etching of the anti-reflection film 203 while using the PR 201 as a mask under the first processing condition.

Further, it is possible to perform the process of plasma-etching the anti-reflection film 203 to a predetermined depth under the first processing condition while using the PR 201 and the scum 210 as a mask without performing the process of removing the scum 210 on the semiconductor wafer W after the development of the PR 201 and then alternately repeat the process of performing the plasma etching of the anti-reflection film 203 under the second processing condition and the process of performing the plasma etching of the anti-reflection film 203 under the first processing condition multiple times.

In the above embodiment, the process of etching the anti-reflection film 203 of the mask layer 200 formed as the triple layer resist by the plasma has been described. However, the present disclosure is not limited thereto. For example, the present disclosure may also be applied to a double-layer resist or a mask layer having a structure of at least four layers as long as the film formed below the PR can be plasma-etched while using the pattern formed in the PR as a mask.

While the disclosure has been shown and described with respect to the embodiments, it will be understood by those skilled in the art that various changes and modifications may be made without departing from the scope of the disclosure as defined in the following claims.

What is claimed is:

1. A plasma etching method for etching a base film on which a patterned photoresist is formed, comprising the steps of:
   (a) etching the base film by a first plasma, under a first processing condition in which a selectivity of the base film to the patterned photoresist is set to a first selectivity, while using as a mask the patterned photoresist formed in a predetermined pattern by exposure and development and a scum remaining, after the development, on an edge of an opening formed in the patterned photoresist, without performing a process of removing the scum; and
   (b) switching, during the etching of the base film, the first processing condition to a second processing condition in which the selectivity of the base film to the patterned photoresist is set to a second selectivity lower than the first selectivity and further etching the base film by a second plasma while using the patterned photoresist as a mask under the second processing condition,
   wherein the base film includes an anti-reflection film and an organic film,
   wherein the step (a) and the step (b), the anti-reflection film is etched by the first plasma and the second plasma,
   wherein the scum disappears during the step (a), and wherein the scum does not remain on the edge of the opening when said etching the base film by the second plasma is restarted under the second processing condition; and
   wherein in step (b), at least a portion of the anti-reflection film is exposed to the opening formed in the patterned photoresist when the first processing condition is switched to the second processing condition and the second plasma begins further etching of the base film.

2. The plasma etching method of claim 1, wherein the first selectivity ranges from 2.5 to 4 and the second selectivity ranges from 0.5 to 1.

3. The plasma etching method of claim 1, wherein in the first processing condition, one of a gaseous mixture of a fluorocarbon gas and a hydrocarbon gas, a gaseous mixture of a fluorocarbon gas and a hydrogen gas, a gaseous mixture of a hydrofluorocarbon gas and a nitrogen gas, and a gaseous mixture of a hydrofluorocarbon gas and a boron trichloride gas is used.

4. The plasma etching method of claim 1, wherein in the second processing condition, a gaseous mixture of a fluorocarbon gas and a hydrofluorocarbon gas is used.

5. The plasma etching method of claim 1, further comprising, after the step (b), the step of (c) switching the second processing condition to the first processing condition during the etching of the base film and further etching the base film by the first plasma while using the patterned photoresist as a mask under the first processing condition.

6. The plasma etching method of claim 1, wherein in the step (a), 20% to 30% of a thickness of the anti-reflection film is etched.

7. The plasma etching method of claim 6, wherein in the step (b), the anti-reflection film is etched until a bottom portion of a groove formed in the anti-reflection film reaches the organic film.

\* \* \* \* \*